(12) United States Patent
Wright

(10) Patent No.: US 6,340,318 B1
(45) Date of Patent: Jan. 22, 2002

(54) METAL TERMINAL

(75) Inventor: David C Wright, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 09/616,370

(22) Filed: Jul. 13, 2000

(30) Foreign Application Priority Data

Jul. 13, 1999 (JP) .......................................... 11-199209

(51) Int. Cl.$^7$ ................................................ H01R 13/42
(52) U.S. Cl. ........................................ 439/751; 439/943
(58) Field of Search .......................... 439/82, 751, 874, 439/943

(56) References Cited

U.S. PATENT DOCUMENTS

| | | | | |
|---|---|---|---|---|
| 4,017,143 A | | 4/1977 | Knowles ..................... | 439/873 |
| 4,752,250 A | * | 6/1988 | Seidler ....................... | 439/751 |
| 5,002,507 A | * | 3/1991 | Sitzler ........................ | 439/751 |
| 5,154,621 A | * | 10/1992 | Legrady ...................... | 439/82 |
| 5,160,270 A | * | 11/1992 | Reymond ..................... | 439/70 |
| 5,169,322 A | * | 12/1992 | Frantz et al. ................. | 439/82 |
| 5,199,908 A | * | 4/1993 | Sucheski ..................... | 439/751 |
| 5,509,814 A | * | 4/1996 | Mosquera .................... | 439/82 |
| 6,098,281 A | * | 8/2000 | Rudi ........................... | 29/845 |

* cited by examiner

Primary Examiner—Brian Sircus
Assistant Examiner—Thanh-Tam Le
(74) Attorney, Agent, or Firm—Oliff & Berridge, P.L.C.

(57) ABSTRACT

A metal terminal is provided for insertion into the installing hole of a circuit substrate. The terminal has a slit that allows the terminal to be elastically deformable in a radial direction. The inserted portion has a tapered part with a diameter decreasing gradually in the insertion direction. The maximum outer diameter portion of the tapered part makes a circumferential linear elastic contact with a contact region. When the tapered part is inserted into the hole, it gradually contracts elastically. This allows the terminal to have a low insertion resistance. Further, if the terminal becomes inclined with respect to the axis of the hole, the maximum outer diameter portion maintains a circumferential linear contact with the inner peripheral surface of the hole.

6 Claims, 4 Drawing Sheets

METAL TERMINAL

BACKGROUND OF THE INVENTION

1. Field of Invention

The present invention relates to a metal terminal suitable for installation on an electrical circuit substrate, and to an electrical circuit substrate having such a terminal installed on it.

2. Description of Related Art

In U.S. Pat. No. 4017143, a metal terminal is shown inserted into a circular installing hole of a circuit substrate so as to bring the metal terminal into contact with a contact region of a printed circuit formed on the inner surface of the installing hole. The metal terminal is of C-shape cross-section, with a slit extending in a direction in which the terminal is inserted into the installing hole to allow the metal terminal to elastically deform in its radial (transverse) direction so that the metal terminal makes elastic contact with the contact region. The outer diameter of the cylindrical metal terminal is axially uniform (i.e. in the metal terminal insertion direction) where it contacts the inner surface of the installing hole. Therefore, in a normally installed state, the metal terminal makes surface-to-surface contact with the contact region. However, if the metal terminal is inclined with respect to the axis of the installing hole, the outer surface of the metal terminal separates from the inner surface of the installing hole and makes point-contact with the edges of the substrate at the openings of the installing hole. Therefore, there may be a defective contact between the metal terminal and the contact region on the inner surface of the installing hole.

SUMMARY OF THE INVENTION

It is an object of the present invention to provide a metal terminal capable of maintaining the intended electrical connection, even if the metal terminal is inclined with respect to the axis of an installing hole.

According to the invention, there is provided a metal terminal for insertion into a circular contact hole of an electrical circuit substrate and for making electrical contact with an inner surface of the contact hole. The metal terminal has an insertion portion having a resiliently deformable outer wall which defines a central cavity with a slit that extends along the outer wall in the insertion direction of the terminal and allows the terminal to contract in the transverse direction. Part of the insertion portion is tapered and narrows smoothly in the insertion direction.

When the terminal is inserted into the contact hole, the outer peripheral surface of the tapered part at the widest portion thereof bears resiliently on the inner surface of the contact hole along a linear contact region. When this occurs, the tapered part gradually contracts elastically as its diameter gradually decreases. Therefore, the metal terminal has a low insertion resistance, making it easy to use. Further, if the metal terminal becomes inclined with respect to the axis of the contact hole, the outer peripheral surface of the tapered part can maintain a circumferential linear contact with the inner surface of the contact hole.

It is preferable that the outer peripheral surface of the tapered part is outwardly convex at its widest portion. Therefore, if the metal terminal is inclined with respect to the axis of the contact hole, there is a reduced risk of the outer peripheral surface of the tapered part damaging the contact region formed on the inner surface of the contact hole.

Another aspect of the present invention provides an electrical circuit substrate having a contact hole, into which a metal terminal, as described above, is inserted. Typically the substrate has electrical circuit elements on at least one of its surfaces, and the terminal makes electrical contact with such a circuit element via a conductive layer in the contact hole.

BRIEF DESCRIPTION OF THE DRAWINGS

The embodiments of the invention are described by way of non-limitative examples with reference to the accompanying drawings, in which.

DETAILED DESCRIPTION OF PREFERRED EMBODIMENTS

Figure 1:
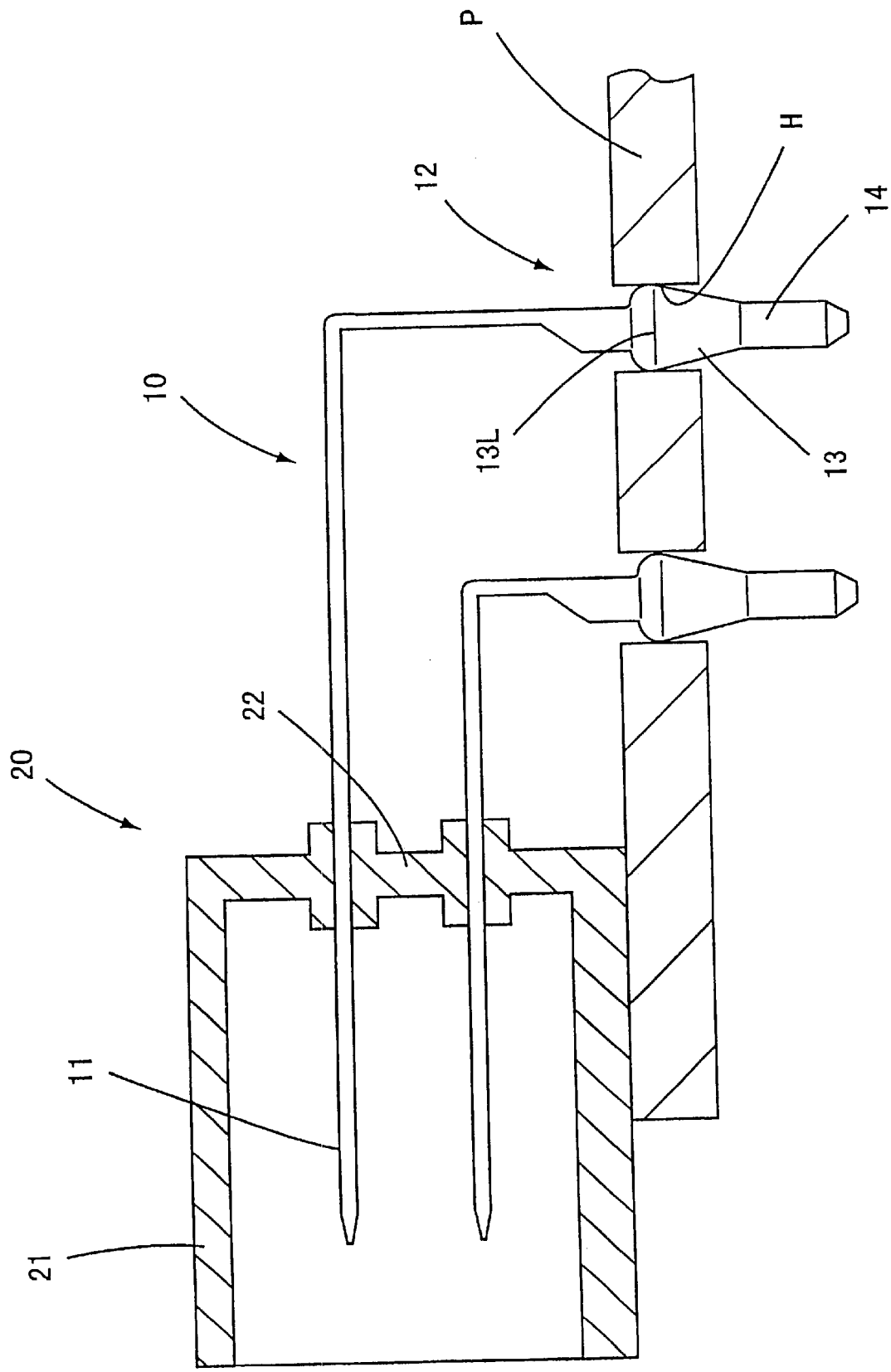
FIG. 1 is a sectional view showing metal terminals inserted in a circuit substrate, in a first embodiment of the invention.

A first embodiment of the present invention is described below with reference to FIGS. 1 through 4.

Two metal terminals 10 of the first embodiment are shown installed on an electrical circuit substrate P, with each metal terminal 10 also mounted on a connector housing 20. The connector housing 20 is made of synthetic resin material and includes a rectangular hood 21 open at the forward portion (left side in FIG. 1) and a supporting wall 22 which closes the rear end of the hood 21. The metal terminals 10 are installed on the connector housing 20 by penetrating through the supporting wall 22.

The circuit substrate P is generally of electrically insulating material and has a printed circuit (not shown) formed on an upper surface thereof. The circuit substrate P has circular contact holes H (referred to below as installing holes) which perpendicularly penetrate the substrate. Each metal terminal 10 is inserted into the respective installing hole H from above. A contact region C continuous with the printed circuit is formed by plating the inner peripheral surface of the installing hole H with a metal. Upon insertion, the metal terminal 10 is brought into contact with the contact region C.

The elongate metal terminal 10 is made of a resiliently deformable electrically conductive metal which is bent in an L-shape. A tab part 11 of the metal terminal 10 penetrates horizontally through the supporting wall 22. A substrate connection section 12 of the metal terminal 10 bent vertically downward from the rear end of the tab section 11 is inserted through the installing hole H of the circuit substrate P. The substrate connection section 12 has an outer wall that defines a central cavity. To allow radial (transverse) elastic deformation, the substrate connection section 12 has a slit 15 extending parallel with the installing hole H axis. The section 12 is, apart from the slit 15, symmetrical about the axis. The upper part of the section 12 includes a tapered connection part 13 whose diameter decreases gradually in the forward (insertion) direction, i.e. downwardly in FIG. 1 and 2, of the section 12. The maximum outer-diameter portion 13L of the tapered connection part 13 makes an elastic circumferential linear contact with the contact region C of the installing hole H.

The outer peripheral surface of the tapered connection part at the widest position thereof (referred to as the maximum outer-diameter portion 13L) has an outwardly convex surface, as seen in FIGS. 1–4. In the uninstalled state, the outer diameter of the maximum outer-diameter portion 13L is larger than the inner diameter of the installing hole H. The minimum diameter of the tapered connection part 13 at its lower end is smaller than the inner diameter of the installing hole H. The substrate connection section 12 has a cylindrical leading part 14 extending from the lower end of the tapered connection part 13 to a tapered lower end. The outer diameter of the leading part 14 is smaller than the inner diameter of the installing hole H.

The terminal 10 is made by punching and bending sheet metal having appropriate resilience in the shaped state.

The operation of the first embodiment is described below.

The metal terminals 10 are installed in the fixing connector housing 20, which is fixed to the upper surface of the circuit substrate P at a predetermined position. The substrate connection section 12 of each metal terminal 10 is inserted downward into the installing hole H. On inserting the section 12 of the metal terminal 10 into the installing hole H, the leading part 14 penetrates the installing hole H, followed by the tapered connection part 13. During insertion of the metal terminal 10 into the installing hole H, the outer surface of the tapered connection part 13 contacts the upper surface of the substrate at the edge of the upper end of the installing hole H. As a result, the tapered connection part 13 is contracted elastically and its diameter is decreased. The inclination of the outer surface of the tapered connection part 13 that contacts the upper edge is small relative to the insertion direction of the metal terminal 10. Thus, the tapered connection part 13 contracts smoothly without being snagged by the upper edge, allowing the metal terminal 10 to have a low insertion resistance.

Figure 2:
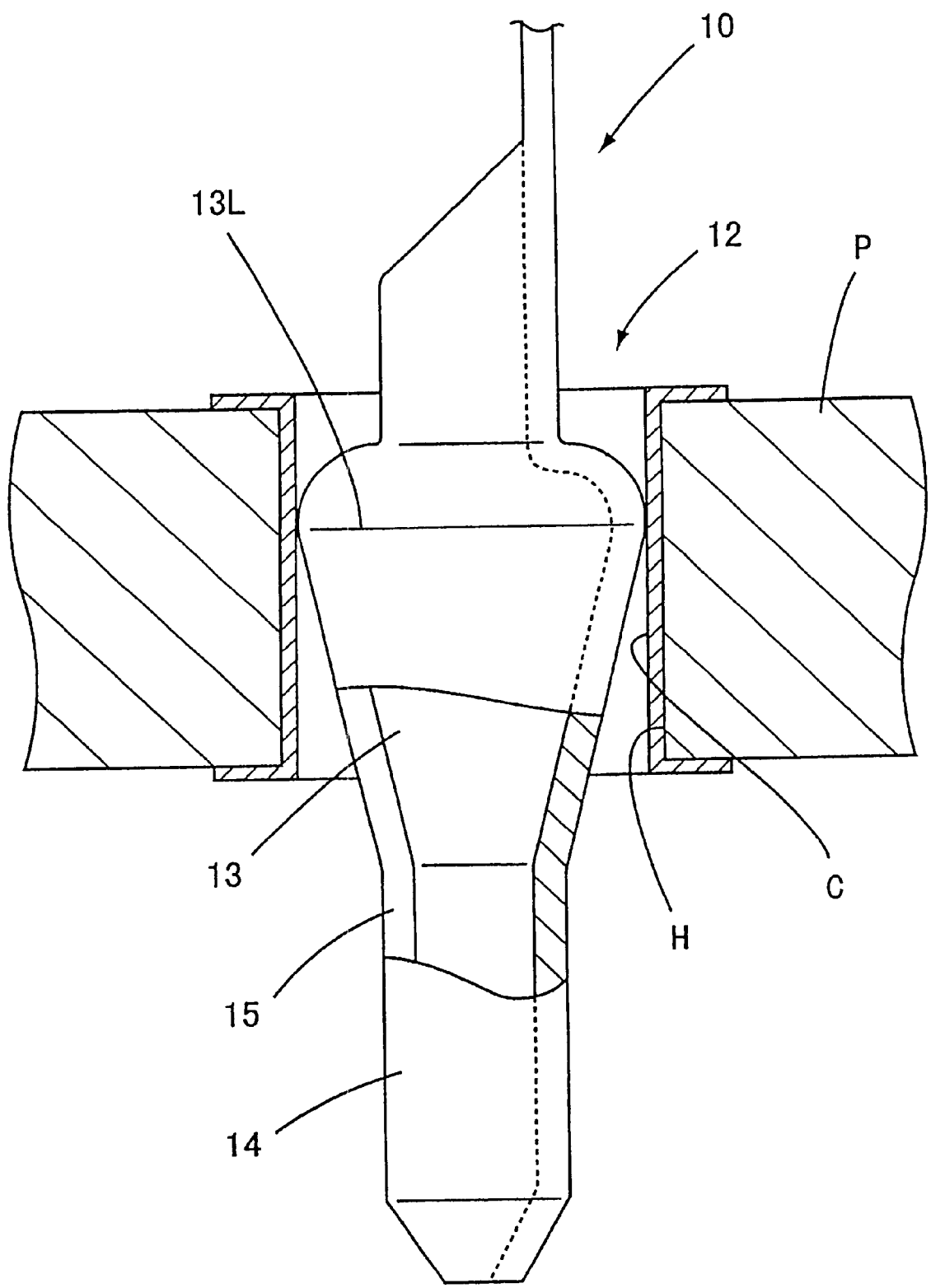
FIG. 2 is an enlarged sectional view of part of FIG. 1 showing a part of one metal terminal inserted into a contact hole of the substrate.

When the connector housing 20 has been fixed to the upper surface of the circuit substrate P, the operation of inserting the metal terminal 10 into the installing hole H is completed. It is to be noted that the metal terminal 10 is not soldered to the inner surface of the installing hole H. When the connector housing 20 has been fixed to the upper surface of the circuit substrate P, the maximum outer-diameter portion 13L of the tapered connection part 13 bears elastically on the contact region C of the inner surface of the installing hole H. Thus, the metal terminal 10 makes electrical contact with the contact region C with a predetermined contact pressure. The maximum outer-diameter portion 13L of the tapered connection part 13 makes a linear contact with the contact region C with a contact pressure that is approximately uniform around the entire circumference of the maximum outer-diameter portion 13L, as shown in FIG. 2. Further, because the tapered connection part 13 bears elastically on the inner surface of the installing hole H, the metal terminal 10 can be prevented from moving radially relative to the axis of the installing hole H.

To remove the metal terminal 10 from the installing hole H, the substrate connection section 12 of the metal terminal 10 is pulled out from the installing hole H, with the connector housing 20 being lifted above the circuit substrate P. During the withdrawal operation, the outer surface of the tapered connection part 13 makes sliding contact with the edge of the upper end of the hole H, with the tapered connection part 13 being restored to its original state as its diameter is increased. The elastic restoring force of the tapered connection part 13 urges the metal terminal 10 in the withdrawal direction, thus accelerating the withdrawal.

Figure 3:
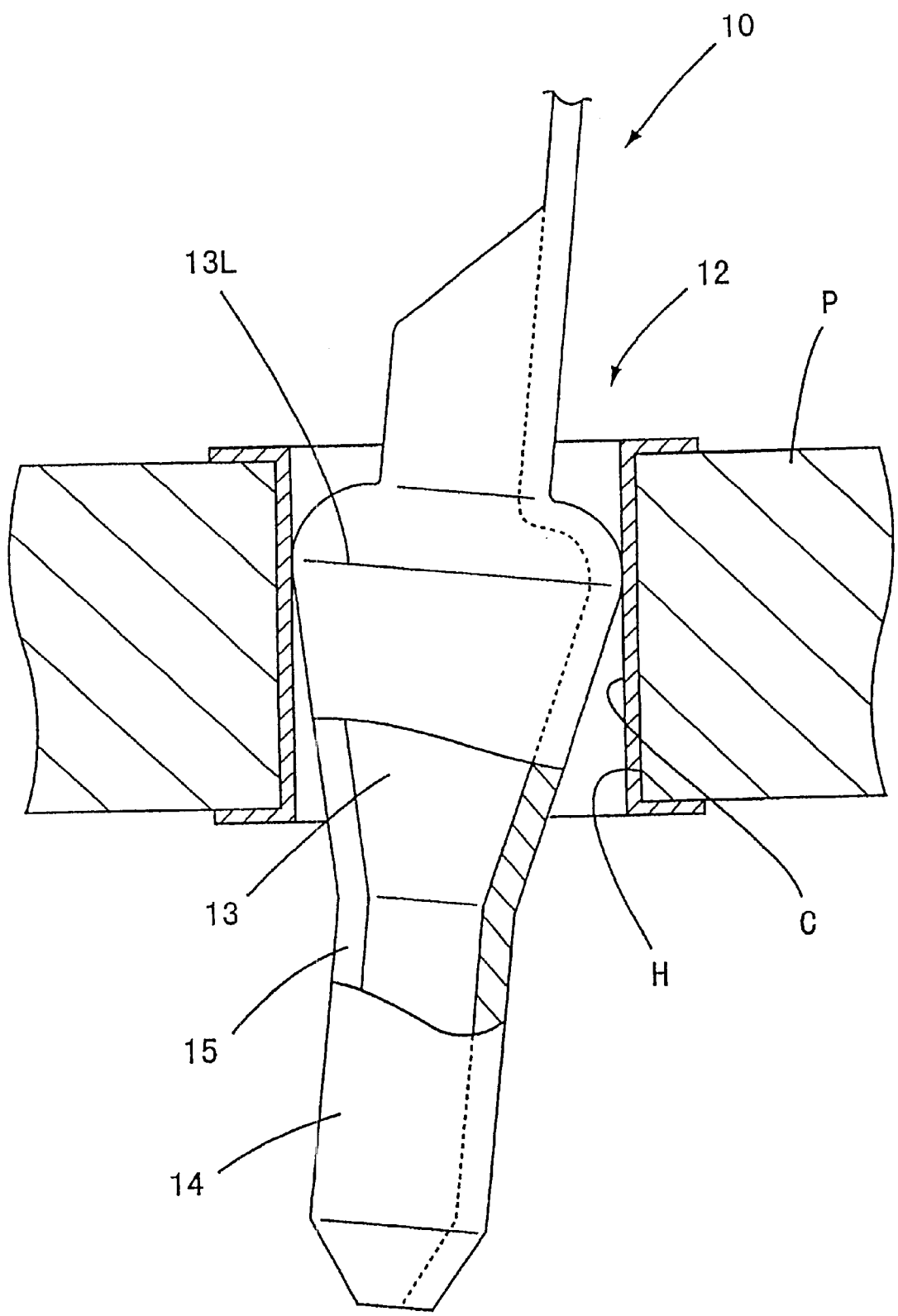
FIG. 3 is an enlarged sectional view corresponding to FIG. 2, in which the metal terminal becomes inclined in the contact hole.
Figure 4:
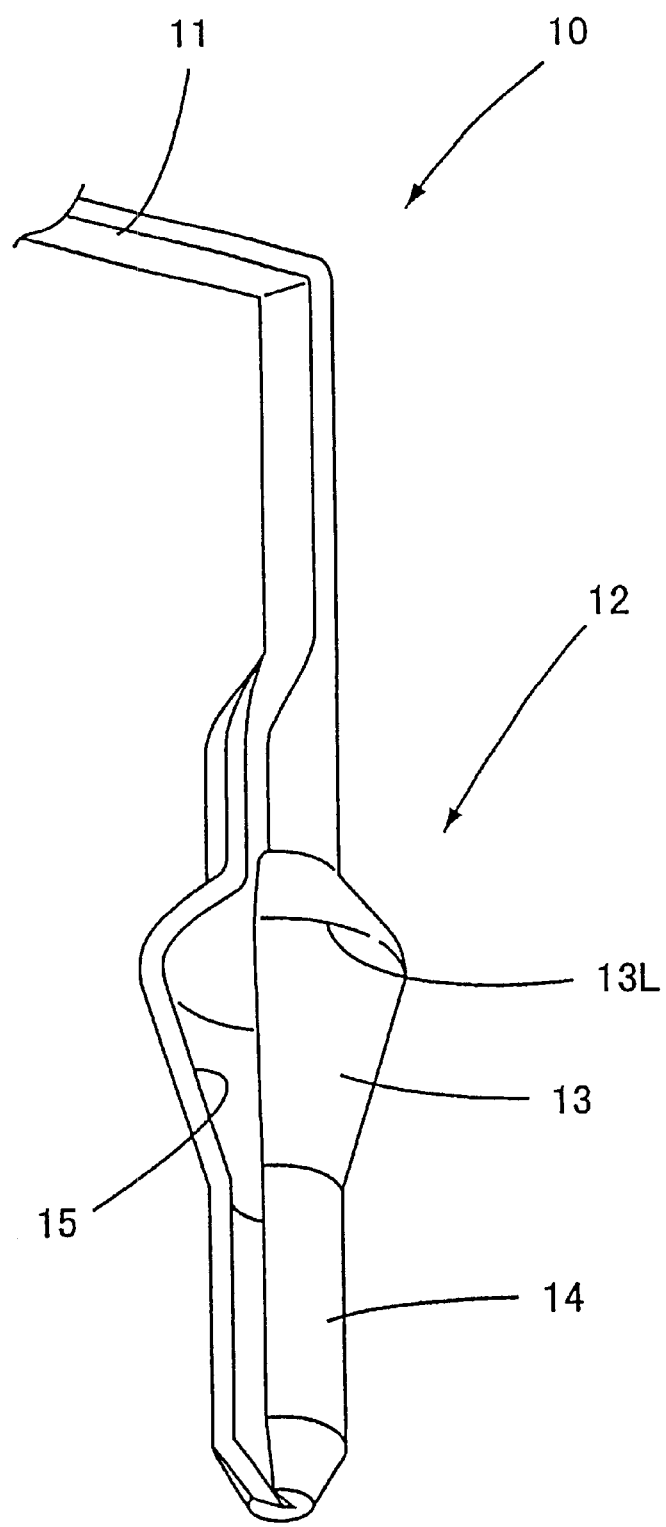
FIG. 4 is a perspective view of a part of one metal terminal shown in FIG. 1.

The metal terminal of the prior art has a cylindrical part with a uniform outer diameter for making electrical contact. The outer surface of the cylindrical part separates from the inner surface of the installing hole when the metal terminal is inclined with respect to the axis of the installing hole. In this case, the outer surface of the cylindrical part may make only two-point contact, i.e., with the upper and lower edges of the installing hole. Thus, defective contact between the metal terminal and the inner surface of the installing hole can occur. However, the metal terminal 10 of the first embodiment of the present invention does not have this disadvantage. The metal terminal 10 contacts the inner surface of the installing hole H, with the maximum outer-diameter portion 13L of the tapered connection part 13 making the circumferential linear contact with the inner surface of the installing hole H. Thus, when the metal terminal 10 is inclined with respect to the axis of the installing hole H, as shown in FIG. 3, the maximum outer-diameter portion 13L maintains linear contact around the entire circumference of the inner peripheral surface of the installing hole H, the tapered connection part 13 being slightly deformed into an elliptical cross-section. Accordingly, the metal terminal 10 and the contact region C are capable of maintaining the intended contact state. A displacement of the contact line between the outer surface of the maximum outer-diameter portion 13L and the inner surface of the installing hole H occurs when the metal terminal 10 inclines with respect to the axis of the installing hole H. However, because the maximum outer-diameter portion 13L of the tapered connection part 13 is not angular, but has an outwardly convex surface, there is less possibility that the metal terminal 10 damages the contact region C on the inner surface of the installing hole H.

The present invention is not limited to the above-described embodiment. For example, the following embodiments are within the technical scope of the present invention.

(1) In the first embodiment, the outer surface of the maximum outer-diameter portion of the tapered connection part is outwardly convex (as seen in axial section). However, the maximum outer-diameter portion may be angular (i.e., have an apex as seen in axial section).

(2) In the first embodiment, it is possible to form a stop member on the metal terminal to prevent insertion of the metal terminal beyond a point where the stop member reaches the substrate surface at the edge of the end of the installing hole.

(3) In the first embodiment, the connector housing is arranged to receive a mating connector to connect the metal terminal and a mating metal terminal. As an alternative, another electrical component, such as an electrical wire, may be directly connected to the metal terminal.

(4) In the first embodiment, the radius of curvature of the maximum outer-diameter portion of the tapered connection part is smaller than the radius of the installing hole. However, according to the present invention, the radius of curvature of the maximum outer-diameter portion may be equal to the radius of the installing hole. In this case, irrespective of the inclination of the metal terminal with respect to the axis of the installing hole, the line of contact between the inner surface of the installing hole and the outer surface of the metal terminal is constantly maintained and the tapered connection part maintains a circular cross-section.

Although the invention has been described above in relation to particular embodiments, many variations are possible within the spirit and scope of the invention herein described, as would be clear to one skilled in the art.

What is claimed is:

1. A metal terminal for insertion into a circular contact hole of an electrical circuit substrate and making electrical contact with an inner surface of the contact hole, comprising:

an insertion portion having a resiliently deformable outer wall which defines a central cavity and a slit which extends along said outer wall in an insertion direction of the terminal and allows the terminal to contract in a direction transverse to the insertion direction, at least a portion of said insertion portion being a tapered part that narrows smoothly in the insertion direction, wherein an outer peripheral surface of said tapered part at a widest portion is outwardly convex along an axis parallel to said insertion direction and sized to bear resiliently on an inner surface of the circular contact hole along a circumferential linear contact region.

2. The metal terminal of claim 1, wherein even if the metal terminal is inclined relative to the contact hole, the circumferential linear contact is maintained.

3. An electrical circuit comprising:

a substrate having a circular contact hole; and a metal terminal inserted into said contact hole to make electrical contact with an inner surface of said contact hole, said metal terminal having an insertion portion received in said contact hole and having a resiliently deformable outer wall that defines a central cavity and a slit that extends along said outer wall in an insertion direction of the terminal into said contact hole and allows the terminal to contract in a direction transverse to said insertion direction, at least a portion of said insertion portion being a tapered part that narrows smoothly in the insertion direction, wherein an outer peripheral surface of said tapered part at a widest portion thereof is outwardly convex along an axis parallel to said insertion direction and bears resiliently on said inner surface of said circular contact hole along a circumferential linear contact region.

4. The electrical circuit of claim 3, wherein even if the metal terminal is inclined relative to the contact hole, the circumferential linear contact is maintained.

5. An electrical connector, comprising:

an electrical connector housing; and a metal terminal mounted on the electrical connector housing, the metal terminal being provided for insertion into a circular contact hole of an electrical circuit substrate and making electrical contact with an inner surface of the contact hole, the metal terminal comprising an insertion portion having a resiliently deformable outer wall which defines a central cavity and a slit which extends along said outer wall in an insertion direction of the terminal and allows the terminal to contract in a direction transverse to the insertion direction, at least a portion of said insertion portion being a tapered part that narrows smoothly in the insertion direction, wherein an outer peripheral surface of said tapered part at a widest portion is outwardly convex along an axis parallel to said insertion direction and sized to bear resiliently on an inner surface of the circular contact hole along a circumferential linear contact region.

6. The electrical connector of claim 5, wherein even if the metal terminal is inclined relative to the contact hole, the circumferential linear contact is maintained.

* * * * *